(12) United States Patent
Hathaway et al.

(10) Patent No.: US 6,615,395 B1
(45) Date of Patent: Sep. 2, 2003

(54) METHOD FOR HANDLING COUPLING EFFECTS IN STATIC TIMING ANALYSIS

(75) Inventors: David J. Hathaway, Underhill Center, VT (US); Chandramouli V. Kashyap, Austin, TX (US); Byron L. Krauter, Austin, TX (US); Sharad Mehrotra, Austin, TX (US); Alexander J. Suess, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/467,208

(22) Filed: Dec. 20, 1999

(51) Int. Cl.[7] .............................................. G06F 17/50
(52) U.S. Cl. .................................... 716/6; 716/4; 716/5
(58) Field of Search .......................................... 716/4–6

(56) References Cited

U.S. PATENT DOCUMENTS

| | | | |
|---|---|---|---|
| 4,263,651 A | | 4/1981 | Donath et al. |
| 5,210,700 A | | 5/1993 | Tom |
| 5,508,937 A | | 4/1996 | Abato et al. |
| 5,648,909 A | | 7/1997 | Biro et al. |
| 6,253,359 B1 | * | 6/2001 | Cano et al. |
| 6,353,917 B1 | * | 3/2002 | Muddu et al. ................. 716/6 |
| 6,378,109 B1 | * | 4/2002 | Young et al. .................. 716/4 |
| 6,405,348 B1 | * | 6/2002 | Fallah-Tehrani et al. ....... 716/4 |

OTHER PUBLICATIONS

Hitchcock, et al. "Timing Verification and the Timing Analysis Progam" IEEE, 19th Design Automation Conference, 1982 pp. 594–604.

* cited by examiner

*Primary Examiner*—Vuthe Siek
(74) *Attorney, Agent, or Firm*—H. Daniel Schnurmann

(57) ABSTRACT

A method for performing a static timing analysis on an integrated circuit chip or module taking into account the effect of wiring interconnection coupling is described. The wiring interactions are modeled as appropriate equivalent grounded capacitances, allowing traditional delay calculation methods to be applied. The method includes the steps of assigning a pessimistic value to the wiring coupling interaction between nets forming the integrated circuit chip; performing the static timing analysis using computed timing parameters which are a function of net capacitance, the net capacitance being based on the pessimistic value of the coupling interaction between the nets; updating the net capacitance of selected nets based on 1) an overlap between an arrival time window of each of the selected nets and a possible arrival time window of each of the other nets which are coupled to the each of selected nets, and 2) on the slew of each of the selected nets and the slew of each of the other nets which are coupled to the selected nets; and updating the static timing analysis based on the updated net capacitances of the selected nets.

25 Claims, 4 Drawing Sheets

US 6,615,395 B1

METHOD FOR HANDLING COUPLING EFFECTS IN STATIC TIMING ANALYSIS

FIELD OF THE INVENTION

This invention relates to the electronic design of integrated circuit chips and packages and more particularly, to a static timing analysis which is required to ensure the functionality and performance of the integrated circuit.

BACKGROUND OF THE INVENTION

Conventional static timing analysis normally assumes static loads on nets. Coupling (e.g., interactions between adjacent wires) causes interactions which are not easily handled in conventional static timing analysis. One reason for the problems is that coupling can prevent the levelization of the logic network on which static timing analysis algorithms depend.

A vital part of the design of a digital system is the verification of the performance of the system. One method for verifying performance is to simulate the system in a simulator capable of modeling the behavior and delays of the system components. However, the number of possible data patterns which can be processed by the system is so large (exponential in the number of system inputs and state storage elements) even for very small systems, that only an extremely small fraction of these patterns can ever be simulated. Thus, a complete performance verification cannot be accomplished through simulation alone.

An alternative method for performance verification is a static timing analysis. This method is typically applied to synchronous circuits, in which a clock is used to control latches which store the results of logical operations performed in combinational logic networks, thus synchronizing the operation of the system. Proper operation of such systems requires that the correct data be present at a latch input before the clock event which stores the data into the latch, and also that the correct data be held at the latch input until it has been stored into the latch.

Static timing analysis verifies these conditions by determining the longest and/or the shortest paths through the network, or equivalently, by determining the latest possible time that correct data may arrive (become stable) at any given point of the system (e.g., a latch input) and/or the earliest that the correct data may be removed (become unstable) at any given point of the system. This is done without regard to the particular data values propagating through the system, and is thus able to completely verify the system performance without having to explore the enormous volume of possible data patterns.

Static timing analyzers typically deal with arrival times (ATs) and required arrival times (RATs). These times are generally specified with respect to the beginning of a cycle whose period is determined by a clock used to synchronize the system. Such analyzers typically operate on a timing graph containing nodes at which ATs and RATs are computed and directed edges which interconnect the nodes and which represent the time (delay) it takes for a value change on the source node to propagate to the sink node. The timing graph for a synchronous system will be acyclic (ignoring possible edges through latches). In systems having multiple clocks, these ATs and RATs are typically specified relative to different time frames and translations must be performed between these different time frames. One method for performing this translation is described in U.S. Pat. No. 5,210,700 to Tom.

The late mode AT of a node represents the latest time that the node value may become stable, while the late mode RAT represents the earliest time at which the node value needs to become stable to ensure that the node does not contribute to an improper system operation. Similarly, the early mode AT of a node represents the earliest time at which the node value may become unstable, and the early mode RAT represents the latest that the node value needs to held stable to ensure that the node does not contribute to improper system operation.

Static timing analyzers typically operate in one of two ways: a path oriented mode or a block oriented mode.

Path oriented analyzers trace the various latch-to-latch or input-to-output paths in the system. A separate AT is computed for a given node along each path leading to the node. Because the number of paths through a system can be very large (exponential in the number of elements in a path), this method takes a long time to fully analyze a system. Explicit or implicit methods can be used to prune the paths to be traced, but such pruning cannot completely solve the run time problem. One example of a path tracing static timing analysis method is described in U.S. Pat. No. 5,648,909 to Biro, et al.

Block oriented analyzers perform a levelization, or topological sort of the network (which is possible because the timing graph is acyclic) and then compute ATs in this sort order. In this way, the ATs of all predecessors of a node (nodes from which a path exists to the node) are computed before the AT of the node. Only a single AT needs to be computed for each node in the network. In the late (early) mode, it is the max (min) over all in-edges to the node of the AT of the edge source plus the edge delay. RATs are computed in reverse order on this topologically sorted network. The topological sort can be done explicitly or implicitly as a result of a depth first search, as described in U.S. Pat. No. 5,508,937 to Abato, et al.

It is also possible to update incrementally the results of a static timing analysis when some timing-relevant characteristics of the system under analysis change. Such changes can be modeled as additions, deletions, or changes to the delay value of edges in the delay graph. A method for performing such incremental timing updates is described in the previously mentioned U.S. Pat. No. 5,508,937.

More general information on static timing analysis can be found in an article by R. B. Hitchcock, Sr., entitled "Timing Verification and the Timing Analysis Program", published in the Proceedings of the 18th Design Automation Conference, 1982, pp. 594–604, and in U.S. Pat. No. 4,263,651 to Donath et al.

The delays of edges in a timing graph typically reflect the delay through either a block (circuit) in the system, or from the source to a sink of a net in the system. In a system implemented with CMOS integrated circuits both of these delays will typically depend on the capacitive load on the net being driven by a block or whose delay is being computed, and on the signal slew (defined as the transition time or rise or fall time) at the source node of the edge. Traditionally, the capacitive load has been assumed to be a capacitance coupled to ground. In modern integrated circuits, the wires comprising the nets of the integrated circuit are physically very close together, and thus the coupling capacitance between them is often greater than the capacitance from the net to ground. Since these neighboring wires will be switching, the grounded capacitance assumption is invalid.

OBJECTS OF THE INVENTION

Accordingly, it is an object of the invention to factor in coupling effects in a static timing analysis to be performed on an integrated circuit chip or module being designed.

It is another object of the invention to model wire interactions as appropriate equivalent grounded capacitances, allowing traditional delay calculation methods to be applied.

It is still another object to model the cyclic relationships caused by wire coupling and to safely bound the system timing in a limited number of iterations.

It is yet another object to determine the periods during which the effective load of a given net (i.e., a victim) is affected by transitions on a neighboring net (i.e., an aggressor).

It is a further object to compute the worst case effective load on a victim net based on the arrival times and slews on the victim and aggressor nets.

It is still a further object to replace the capacitance Cc between a victim net and an aggressor net with (1+K)Cc for a late mode and (1−K)Cc for an early mode.

It is still another object to use the ratio between victim and aggressor transitions to determine statically the effective loading seen by the victim.

It is yet another object to interactively time the design until the values for K of all the nets converge or until a user predetermined maximum is reached.

It is a more particular object to use the degree of overlap between the victim and aggressor arrival time windows to statically determine the effective loading seen by the victim.

It is yet a further object to initiate the process with a pessimistic solution to be successively refined to increase the accuracy of the result. Because the initial solution bounds the actual result, the results after any number of refinement iterations (e.g., before the method has converged) can be extracted and still ensure that the result bounds the actual circuit timing.

SUMMARY OF THE INVENTION

Briefly and in general terms, the present invention provides a method for factoring in coupling effects caused by interconnection wires while performing a static timing analysis on an integrated circuit chip, module, card, and the like, being designed. The method includes the steps of assigning a pessimistic value to the wiring coupling interaction between nets forming the integrated circuit chip; performing the static timing analysis using computed timing parameters which are a function of net capacitance, the net capacitance being based on the pessimistic value of the coupling interaction between the nets; updating the net capacitance of selected nets based on an overlap between an arrival time window of the selected nets and possible arrival time windows of nets which are coupled to the selected nets; and updating the static timing analysis based on the updated net capacitances of the selected nets.

In another embodiment of the present invention the updating the net capacitance of selected nets is based instead on the slew of selected nets and the slew of other nets which are coupled to the selected nets.

In yet another embodiment of the invention, updating of the net capacitance is based in a combination of both the overlap between the arrival time window of selected nets and the possible arrival time windows of nets which are coupled to the selected nets as well as the slew of selected nets and the slew of other nets which are coupled to the selected nets.

BRIEF DESCRIPTION OF THE DRAWINGS

The foregoing and other objects, aspects and advantages of the invention will be better understood from the following detailed description of a preferred embodiment of the invention with reference to the drawings, in which.

DETAILED DESCRIPTION OF THE INVENTION

Figure 1:
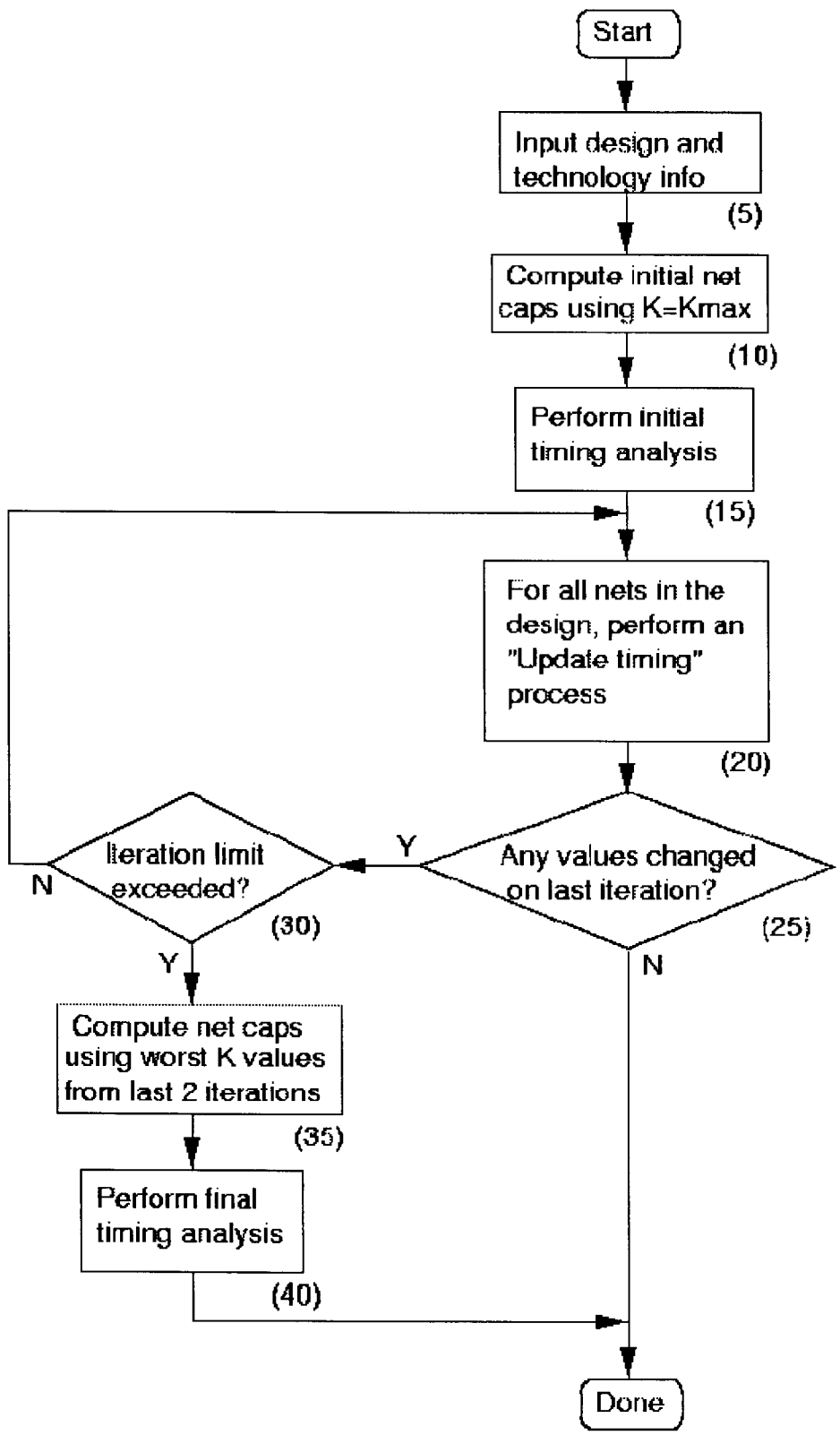
FIG. 1 is a flow chart illustrating the method of the present invention.

The method described in the invention finds an equivalent static capacitance for each coupling capacitance based on the slew of the victim (defined as a net whose delay is affected) and the aggressor (defined as a net whose switching affects the victim delay), and also on the times during which these nets are switching (arrival time windows). The aggressor arrival time window includes the entire time from the early mode arrival time to the late mode arrival time during which the aggressor net could be switching. The victim arrival time window includes only the time during which the victim net is making a particular transition, thus separate early and late mode victim arrival time windows are employed to compute the early and late mode equivalent static capacitances and delays, respectively. The preferred embodiment starts out assuming worst case coupling impacts and iterates to reduce the pessimism until convergence is achieved or some iteration limit is reached.

In the decreasing pessimism embodiment, the sizes of the aggressor arrival time windows decrease during successive iterations, thus reducing pessimism. However, there are circumstances in which the pessimism may temporarily increase. It is assumed that in the course of some iteration, an aggressor net whose late mode arrival time occurs just after the late mode arrival time of a victim net, and whose late mode arrival time is adjusted during this iteration, will now occur just prior to the late mode arrival time of the victim. The late mode arrival time of the victim will also go down since it was slowed by the aggressor in the previous iteration (due to the timing window overlap) but it is not slowed down by it during the present iteration. This reduction in the victim's late mode arrival time may cause it to become less than the aggressor's (or some other potential aggressor's) late mode arrival time. This may in turn increase the effect of the aggressor on the victim, increasing the victim's late mode arrival time and thereby increasing its arrival time window when viewed as an aggressor to some other net. The extra iteration described in the invention attempts to minimize this impact. However, once the property of strictly decreasing pessimism is lost, it is no longer possible to ensure that the final result is not optimistic. To avoid this problem one may detect cases where an arrival time is adjusted in such a way that it is moved out of the aggressor windows of other adjacent nets. In these cases, one may perform a local iteration to determine arrival time and slew values which are not overly optimistic given the current arrival time windows of all the aggressors. This only needs to be done in cases wherein the aggressor/victim overlap window decreases for some aggressor of the victim being adjusted.

Practitioners in the art will readily recognize that the update of the effective equivalent grounded capacitance of any net only needs to be updated when the overlap between arrival time windows of that net and of some aggressor net has changed during the last iteration or when the slew of the victim (or of an aggressor) was modified in the last iteration. Such limitation further reduces the iteration cost. In order to further reduce the run time, it is advantageous to only process those coupled nets which have a slack below a certain specified threshold. The decreasing pessimism nature of the approach makes a slack based cut-off criteria feasible. In addition, one may restrict further processing in the current iteration to those nets whose capacitance value changes exceed a user specified value. This combined with a user specified maximum iteration limit helps trade accuracy for speed and vice-versa.

The invention further assumes that all aggressor nets switch in the same direction as the victim when computing a new early mode equivalent static capacitance for the victim and that all aggressor nets switch in the opposite direction as the victim when computing a new late mode equivalent static capacitance for the victim. The early mode equivalent static capacitance value is then used to compute a new early mode slew. When this victim net is considered as an aggressor to some other net, this early mode slew is used in computing both the early and late mode new equivalent static capacitance on the victim net. For late mode analysis of this second victim net, the assumption is made that the victim and aggressor make transitions in opposite directions. By way of example, let a pair of nets A and B be considered, each of which is to be treated as an aggressor toward the other. An early mode slew on A is computed assuming that B switches in the same direction. Then this early mode slew is used to compute the late mode information on B, assuming that A and B switch in opposite directions. These two assumptions are inconsistent with each other, and further, they introduce pessimism. To avoid this pessimism, a separate early mode slew is computed on each aggressor with respect to each of its victims, assuming that the victim is switching in the opposite direction, but that all other aggressors to the aggressor are switching in the same direction. This is more expensive because it requires computing multiple slews for each aggressor; thus, this extra step is to be performed only on nets which still have a slack below the slack threshold value after the simpler iteration.

Many variations on this method are possible. Described herein is a preferred embodiment of the invention, followed by its application to a simple example (shown in FIG. 3). The normal static timing formulation will be used in which a delay graph is derived from or implied by the circuit schematic including delay arcs between block inputs and outputs and between net sources and sinks (shown in FIG. 4). The late mode arrival time (AT) at a node is the maximum over all incoming arcs of the late mode AT at the source of the arc added to the delay of the arc. The early mode AT is the minimum over all incoming arcs of the early mode AT at the source of the arc added to the delay of the arc. The late mode required arrival time (RAT) at the a node is the minimum over all outgoing arcs of the late mode RAT at the sink of the arc minus the delay of the arc. Late mode slack at a node is defined as RAT−AT, while an early mode slack is defined as AT−RAT. This implies that a negative slack always indicates the failure to meet the timing requirements of the design. The early mode RAT is the maximum over all outgoing arcs of the early mode RAT at the sink of the arc minus the delay of the arc. A more complete timing model may include test arcs, but these are not necessary for the understanding of the invention and will be omitted from this discussion. Throughout the discussion, any reference to "updating timing analysis results" will be assumed to be performed using a method such as that described in the aforementioned U.S. Pat. No. 5,508,937.

A flow chart of the method of the invention is shown with reference to FIG. 1. Referring to the flow chart, the method begins with step 5 by inputting a design and related technology information (e.g., delay rules, capacitance and resistance per unit length, etc.). The design input generally consists of a complete electrical schematic showing the detailed parasitic capacitance and resistance (at least on those nets which exhibit significant coupling). However, it may only include lumped net capacitances and RC values based on the "K=Kmax" assumption (to be explained hereinafter). In this case, an additional means (not shown) must be provided to extract detailed coupling parasitic information when needed. The method of the invention proceeds with step 10 by computing equivalent grounded segment capacitances for all the net segments exhibiting coupling, assuming worst case aggressor conditions. This condition is reflected by a K value of Kmax. The K value represents the amount by which the effect of the coupling capacitance on the net increases or decreases due to switching on the net to which it is coupled. It is chosen so that the total charge needed to change the voltage on the equivalent grounded capacitance equals the actual charge required to change the voltage on the net in the presence of switching on an adjacent net. The victim net sees a voltage change equal to the power supply voltage (Vdd), so given a charge Q implies an equivalent grounded capacitance of Vdd/Q (from the definition of capacitance). The actual voltage change across the coupling capacitance is Vdd±the change in voltage on the aggressor. This voltage in turn depends on how much of the transition on the aggressor can occur during the transition on the victim. If delays on the victim are measured at the 50% crossing point, one may be only interested in the voltage change on the aggressor occurring during the first half of the victim transition which is then added to a voltage change of Vdd/2 (the amount the victim net changes up to the 50% measurement point). If the aggressor transition is longer than the victim's transition and the arrival time windows overlap completely, the voltage change on the aggressor (assuming a trapezoidal waveform approximation) will be slew (victim)/slew (aggressor). The early mode slew of the aggressor net is used because this presents the largest possible impact on the victim net, thus ensuring that the timing results present safe bounds on the actual circuit behavior. When the arrival time windows do not completely overlap one must consider the different degrees of possible overlap between aggressor and victim transitions, determined by the overlap between their arrival time windows. In this case, the interaction period (IP) between the waveforms (the maximum amount of time during which the aggressor transition could be affecting the victim) is given by:

$$IP=\min(\text{slew(victim)}, \text{slew(aggressor)}, \text{overlap}).$$

The formula used for computing K values is:

$$K=\{IP/\text{slew(aggressor)}\}*\min\{Kmax, \text{slew(victim)}/IP\}$$

For the initial calculation the slews on the nets are not known, nor the ATs which control the amount of possible overlap. Thus, a worst case value of Kmax is used. The value of Kmax depends on an analysis and judgement as to what is the maximum amount by which a coupling capacitance can be magnified or masked due to switching taking place on an aggressor net. It may depend on the way how delays and slews are measured. Typically, a maximum K value of 1 is used, indicates that the aggressor switching can completely mask the coupling capacitance in early mode, and can double the coupling capacitance in a late mode. The equivalent total grounded capacitance Ct for each victim net segment is then computed as $Ct=Cg+(1+K)*Cc$ for the late mode, and $Ct=Cg+(1-K)*Cc$ for the early mode, wherein Cg is the actual capacitance-to-ground for the segment and Cc, the coupling capacitance for that segment. These capacitance values are then used in step 15 to compute delays used in a conventional static timing analysis. In step 20, each net in the design is examined, followed by an update of the delays and of the timing analysis due to the effects of coupling on that net (described in detail below). In step 25, it is determined whether the last loop through the nets of the design resulted in any changes in timing values (due to changes in K values). If no change occurred, the process is deemed complete. If the last iteration caused changes, one proceeds to step 30, wherein it is determined whether or not some user-specified limit on the number of iterations has been exceeded. If it has not, a branch to step 20 follows, to again update the timing analysis based on coupling information. If the iteration limit has been exceeded, a final timing analysis may be needed to prevent optimistic results from being reported. This is accomplished by steps 35 and 40. These steps may be omitted if the method used to update the timing analysis is guaranteed not to introduce any optimism. Since any method set to guarantee this property is more expensive than one which does not, it may be preferable to perform instead steps 35 and 40 to eliminate this pessimism and to compute equivalent grounded capacitance values for all net segments based on these K values. This is accomplished in step 35, choosing for each coupling capacitance the most pessimistic (largest) K value of those found during the last two iterations through step 20. These K values are selected because the predominant form of optimism that may be introduced is due to an "overshoot" in the reduction of the K value for a coupling capacitance. The "overshoot" can occur if an improvement on the victim delay increases the degree of overlap between the victim and aggressor windows (explained hereinafter). The increase in one iteration can cause the K value for the coupling capacitance to be too low, because it is based on too small an overlap value. This overshoot is normally corrected during the subsequent iteration. Thus, by choosing the larger of the last two K values one avoids choosing a K which is too low due to the undershoot phenomenon. The capacitances computed using these K values are then used in step 40 to perform a final update to the delay calculation and timing analysis.

Figure 2:
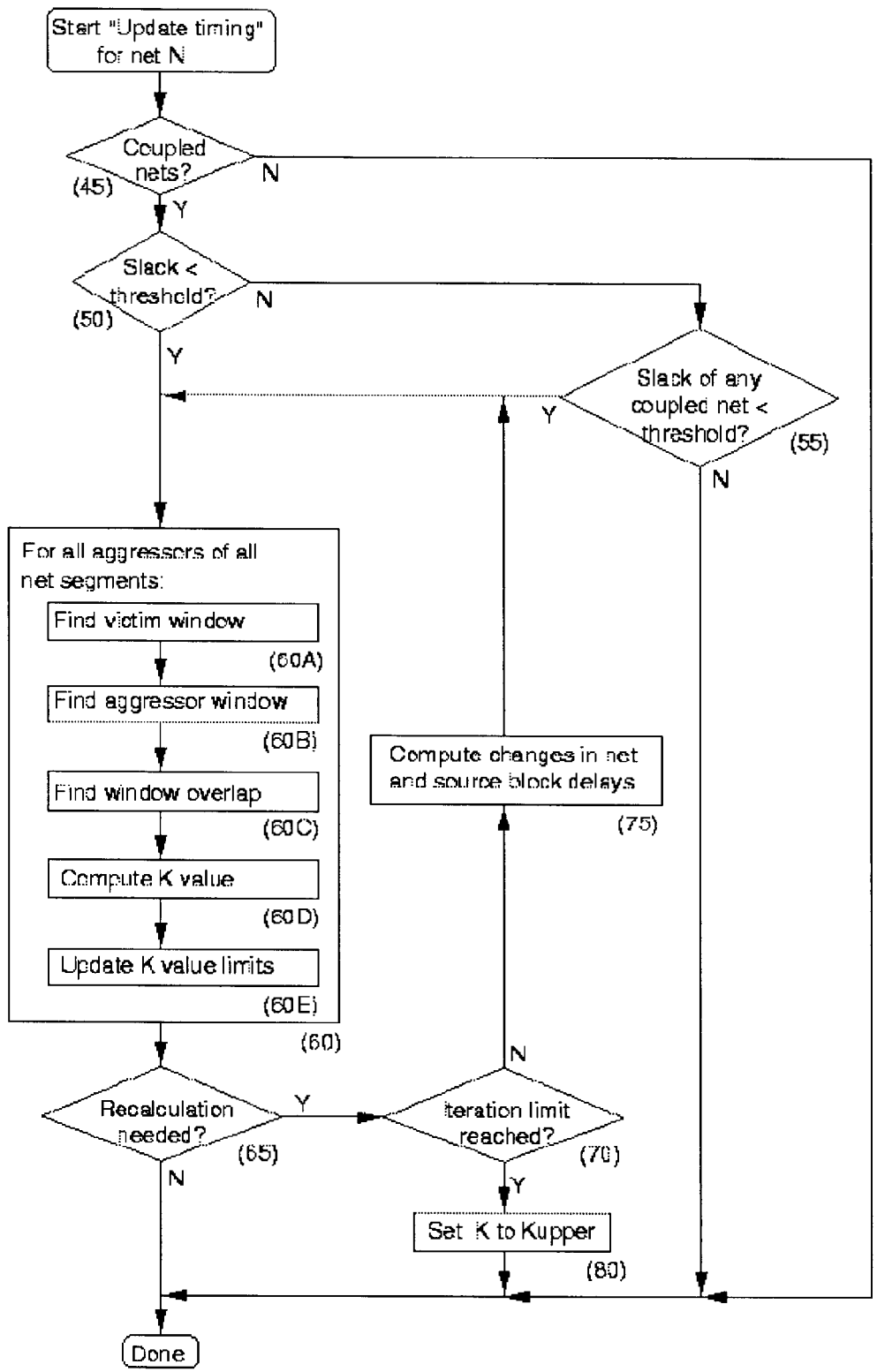
FIG. 2 is a flow chart of the method of updating the timing analysis by refining the equivalent static capacitance and resulting delay for a given net.

The flow chart shown in FIG. 2 shows the details of the process of updating the timing due to the effects of a coupling on a particular net N.

The process is initiated at step 45 by determining whether any of the segments of net N exhibit coupling. If not, the net N capacitance needs no adjustment and the process stops. If net N exhibits coupling, it is determined in step 50 whether its slack (more specifically, the slack of any of its pins) is less than some user specified threshold (typically 0 if attempting to determine whether any timing violation exists). If the slack is below the threshold or, as determined in step 55, the slack of some net V coupled to the selected net is below the threshold, a branch to steps 60 through 70 follows to update the timing due to coupling on net N. Step 55 may be omitted at the possible cost of excess pessimism in the timing results. This can occur if net N is an aggressor to a critical net V (defined as a net which slack is below the threshold) and an adjustment to the timing of net N reduces the aggressor window of net N with respect to net V in a way that improves the timing of net V. This can be carried further by considering whether any chain of nets X1 . . . Xm exists such that net N couples to net X1, net Xi couples to net Xi+1, and net Xm couples to critical net V. Such an extension (not shown above) will generally increase the run time of the analysis with little benefit in reduced pessimism, and thus is not included in the preferred embodiment.

In step 60, all segments S of net N are examined, the segment capacitance is updated, and these newly obtained capacitances are used to further update the delays affected by these capacitance changes and, subsequently, the timing analysis. In sub-step 60A, the victim window for the selected net is found. Four separate victim windows are selected for the late and early modes rising and falling delays. In each case, the start of the window is the AT of the selected transition at the source pin of the net minus one-half the slew associated with that AT. The end of the victim window is the maximum over all net sinks of the AT of the selected transition at the sink plus one-half the slew associated with that AT. Variations in these victim arrival time windows are possible. If, for example, the victim delay of interest is the time it takes for a signal on the victim net to reach the midpoint between the power supply voltage (Vdd) and ground, only the interactions during the first half of the signal transition are of interest. In this case, the endpoint of the victim arrival time window may instead be defined as simply the arrival time of the signal. In sub-step 60B, the aggressor arrival time window is determined for each aggressor net segment A exhibiting coupling to net segment S. Only two aggressor arrival time windows are found, i.e., for rising and falling transitions. The start of the aggressor arrival time window is the early mode AT for the transition at the aggressor net source minus one-half the early mode slew associated with that AT. The end of the aggressor arrival time window is the maximum over all the sinks of the aggressor net fed through segment A of the late mode AT for the transition at the sink plus one-half the late mode slew associated with that AT. In sub-step 60C, a comparison is made between the aggressor and the victim arrival time windows as well as a determination of their degree of overlap. This comparison must take into account any differences in the time base and frequency of the signals on the two nets. A method such as that described in U.S. Pat. No. 5,210,700 can be used for this purpose. For the late mode K factor, the aggressor transition chosen is the opposite of the victim transition being considered, (e.g., choosing a rising aggressor for a falling victim) while for an early mode, the transition chosen is the same as the victim transition. The K value used to determine the effect of this aggressor segment on the coupling capacitance is then determined in step 60D. K is computed as:

$K=\{IP/Sa\}*\min\{K \max, Sv/IP\}$, wherein the interaction period IP is computed as:

$IP=\min(Sv, Sa, O)$.

Sv is the maximum over all the sinks of the victim net of the slew associated with the transition under consideration, Sa is the minimum early mode slew of the aggressor transition being considered, and O is the overlap between the aggressor and victim arrival time windows. This formula for K can be understood as follows. IP is the interaction period of the two waveforms. So, the first ratio (IP/Sa) is the maximum fraction of Vdd through which the aggressor can make a transition while affecting the victim. This ratio is always less or equal to 1. The inverse of the second ratio (IP/Sv) is the maximum portion of the victim transition which can be affected by the victim, and is also equal to the maximum fraction of Vdd through which the victim can transition while being affected by the victim. 1/Kmax acts as a bound on this victim sensitivity period. For example, if Kmax=2, then one would allow the full impact of an aggressor to be felt during the first half of the victim transition. Alternatively, even if the aggressor impacts the victim during a very small period of time, when computing an equivalent grounded capacitance its effects over at least 1/Kmax of the victim transition are then spread. Thus, one must limit the ratio to Kmax. The first ratio (IP/Sa) is therefore an aggressor change in voltage ($\Delta Va$) and the second term (min {Kmax, Sv/IP}) is the inverse of a victim change in voltage ($\Delta Vv$) during which it is sensitive to the aggressor. The equivalent grounded capacitance is computed by first determining the amount of charge required to charge the coupling capacitance with both the victim and aggressor switching, and then finding the capacitance which would require that same amount of charge to charge if only the victim were switching. Thus, $Q=Cc(\Delta Vv \pm \Delta Va)=Ceq(\Delta Vv)$, and $Ceq=Cc(\Delta Vv \pm \Delta Va)/\Delta Vv=Cc(1 \pm \Delta Va/\Delta Vv)=Cc(1 \pm K)$.

Therefore K=$\Delta Va/\Delta Vv$, yielding the formula for K given above.

If one chooses to implement the local iterations steps 65, 70, 75, and 80 (explained below), one must also keep track in step 60E of the largest and smallest K value found for each aggressor of net N during the local set of iterations, as Kupper and Klower, initialized to +∞ and −∞, respectively. Consider, during a particular local iteration, the calculation of a new K value, Knew, to replace a K value, Kold, which was computed in the previous iteration. If Knew>Kupper or Knew<Klower, one replaces it with some value between Klower and Kupper, typically Knew=(Klower+Kupper)/2. After finding Knew, if Knew<Kold, one sets Kupper=min (Kupper, Kold). If Knew>Kold, then one sets Klower=max (Klower, Kold).

All the slew-dependent computations described above may be modified slightly to account for the exact definition of slew being used. For example, if slew is defined as the time it takes for the signal to move from 20% to 80% of its final value, one may divide the slews by 0.6 before using them in order to include the (trapezoidally extrapolated) full transition event. These adjustments cancel out when taking the ratio of two slews, but may affect the overlap computation in a way that should be accounted for.

One may also want to extend the aggressor arrival time windows somewhat to account for the recovery time of a victim net when an aggressor switches just before the victim starts its transition. Such an extension occurs only on the positive end of (i.e., after) the aggressor arrival time window. One way for determining how much the arrival time window should be extended, one may use a capacitive divider equation to determine the size of the noise pulse that the aggressor could induce on the 'quiet' victim, and then use the victim slew to determine how long it takes for the victim to recover from that noise pulse. The noise pulse size (defined as a fraction of Vdd) will then be the coupling capacitance to the aggressor divided by the total (grounded+coupling) capacitance of the victim net. One may then expand the aggressor arrival time window by this fraction of the late mode victim slew.

An alternative approach is to compute (in step 60A) only two victim arrival time windows (rising and falling) in the same manner as used for the aggressor arrival time window. This ensures that the process of updating the timing for net N does not produce optimistic results, thus obviating the need for steps 35 and 40 in the main flow chart shown in FIG. 1. This approach can be quite pessimistic, however, causing much larger arrival time window overlaps (in step 60C) than necessary and, thus, this alternative is not recommended. Another alternative is to provide segmented aggressor arrival time windows. This requires that the timing analysis propagate multiple early/late arrival time pairs associated with different subsets of the paths feeding a net. These provides a refinement to the range of times during which the aggressor may be switching, and hence it may affect the victim. Still another alternative (which may be combined with the partitioned aggressor arrival time windows) is to associate some logical information with the arrival time windows to determine the conditions under which the aggressor and victim may switch. In this case, the comparison of arrival time windows also includes a check to determine whether the victim and aggressor may logically switch together, thus further reducing the conditions under which the aggressor's switching affects the victim.

After finding (in step 60) all the K values for all coupling capacitances to net N, one proceeds to steps 65 through 80 which determine whether a local iteration is needed and, if so, perform it. These steps constitute a second approach which ensures that the update timing process for a net does not introduce optimism, and thus obviates the need for steps 35 and 40 in the flow chart shown in FIG. 1. This is an alternative to the case of the wider victim arrival time window described above, both of which are not used together. In step 65, it is determined whether the change of K value causes a change in equivalent static capacitance and consequent net and block delays which cause the victim arrival time window to increase its overlap with any potential aggressor arrival time window. This check should, preferably, include aggressor arrival time windows with which the victim arrival time window does not currently overlap. In this case, a recalculation may be required, in which instance one proceeds to step 70. One may also choose to proceed to step 70 for possible further local iterations if the change in K value causes a change in equivalent static capacitance and consequent net and block delays and slews which causes the victim arrival time window to decrease its overlap with any potential aggressor arrival time window. In this case, further local iteration is not required to ensure that the analysis is not optimistic, but it may produce a more accurate (less pessimistic) K value. In step 70, it is determined whether the iteration limit has been reached. Note that this iteration limit is, in general, different from that used in step 30 of the flow chart shown in FIG. 1. If the iteration limit is not reached, one then proceeds to step 75 which updates the capacitances derived from the new K values which are used to compute new delays and slews for the net and its source block. Even though the updated values for net N may affect the aggressor arrival time window (if there is a path from net N to the aggressor net), it is not required to propagate timing changes beyond net N. This is because the aggressor arrival time window can only be reduced by such propagation, and hence will remain a pessimistic bound on the real aggressor arrival time window. By deferring the propagation of these timing values one speeds up the timing analysis process. One proceeds then back to step 60 by again updating the K values for the coupling capacitances on the net. If in step 65 the iteration limit has been reached, one proceeds to step 80, wherein the K value is set to the Kupper value maintained in step 60E. This ends the processing of this net.

Figure 3:
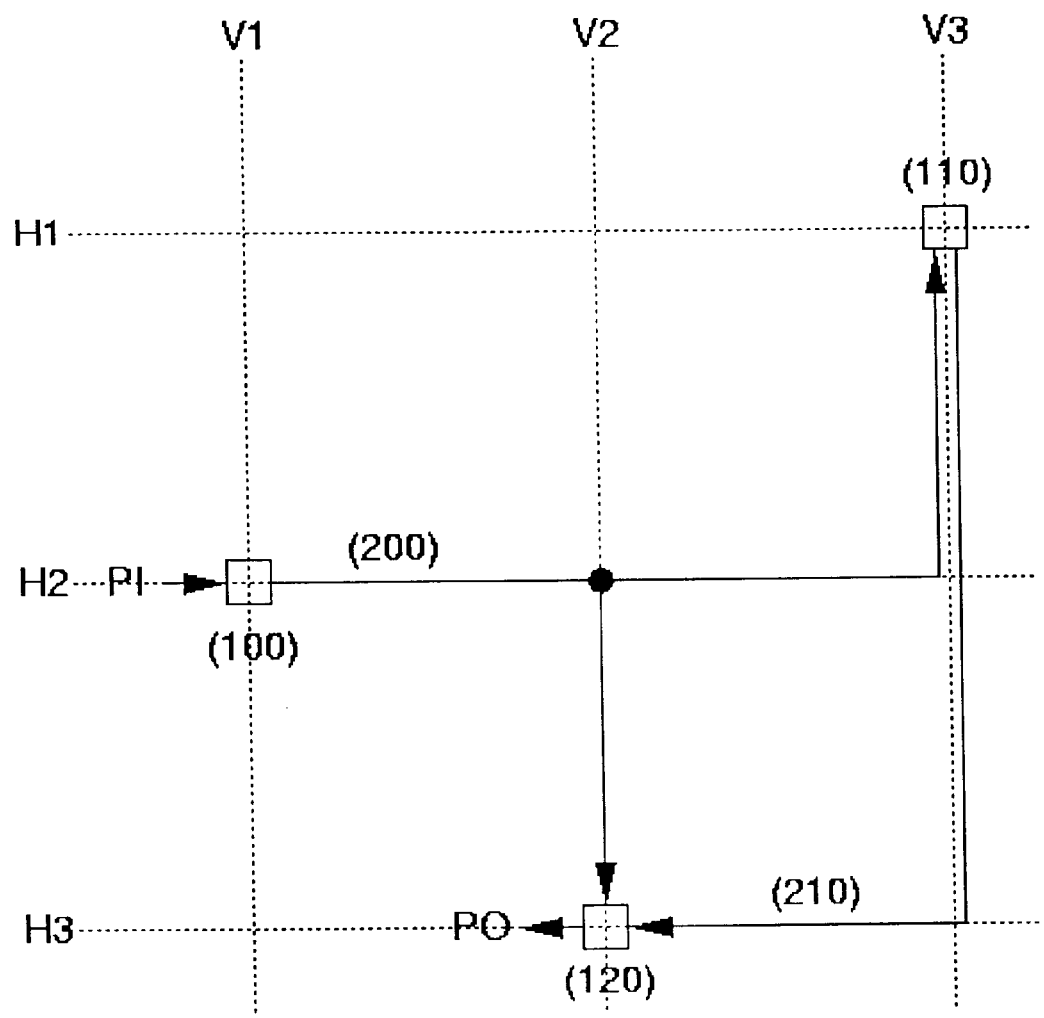
FIG. 3 illustrates an application of the method of the present invention as it applies to a sample circuit.

An application of the method of the invention will now be illustrated with reference to a sample circuit shown in FIG. 3.

Blocks 100 through 120 are circuit elements in the design being analyzed, e.g., NAND gates, latches, etc. Nets 200 and 210 form interconnections between these circuit elements. Grid lines V1 through V3 and H1 through H3 form a unit spaced grid for measuring the lengths of net segments. Net segments are assumed to exhibit coupling between a pair of grid lines whenever they run next to the same perpendicular grid line. By way of example, between horizontal grid lines H1 and H2, nets 200 and 210 run adjacent to grid line V3 are assumed to exhibit coupling for one unit length in this region. For simplicity sake, only one per-unit-length degree of net-to-net coupling is considered in this example, although in reality one may have many different coupling degrees, depending on the spacing between adjacent wires. For simplicity sake, all net segment lengths are rounded to the nearest unit; thus, the horizontal segment of net 200 between grid lines V1 and V3 is assumed to be 2 units long even though it runs from just to the right of V1 to just to the left of V3.

The capacitance-to-ground of the nets in the example is assumed to be 1 fF/unit length and the resistance to be 1 kilohm/unit length. The product of these units gives time units of pS. The coupling capacitance between adjacent net segments is assumed to be 1 fF/unit length. For simplicity sake, it is assumed that the presence of an adjacent coupling wire does not alter the capacitance-to-ground of a net segment, although in reality such coupling reduces the capacitance-to-ground. The capacitance of all net sinks (block inputs) is assumed to be 2 fF, although in reality the sink pin capacitance normally varies for different circuit element types. Where units are omitted in the following discussion, units of fF, kilohms, and psec are implied. A Kmax value of 1 and an output load on block 120 of 0 are assumed. The block delay (both early and late mode) is further assumed to be Dblock=10+5*Cnet; the signal slew (both early and late mode) at the output of a block to be 5+3*Cnet, and the net delay to be one-half of the well-known Elmore delay, defined as the sum over all the net segments in a source-to-sink path of Rsegment*(Csegment/2+Cdownstream). Cdownstream is the total capacitance which must be charged or discharged through the net segment when the net switches, i.e., the total capacitance on the end of the net opposite the source, as seen from the net segment in question. The signal slew at a net sink will be assumed to be the slew at the source plus the Elmore delay. In practice, a more accurate net delay and slew are used, and are computed using one of the well-known model-order reduction techniques. The capacitance used in computing the block delay and slew can also be viewed as the effective capacitance seen by the net source (based on the net source slew) rather than the total net capacitance. These details, though, complicate the explanation and are not critical to the implementation. For simplicity, no distinction was made in this example between rising and falling transitions; thus, at most two victim arrival time windows (late and early) and one aggressor arrival time window per net will be computed.

Both, the early and late mode arrival times (ATs) at the PIs (primary inputs) feeding block 100 are assumed to be 0. The early and late mode required arrival times (RATs) at the PO fed by block 120 are assumed to be 80 and 120, respectively.

Figure 4:
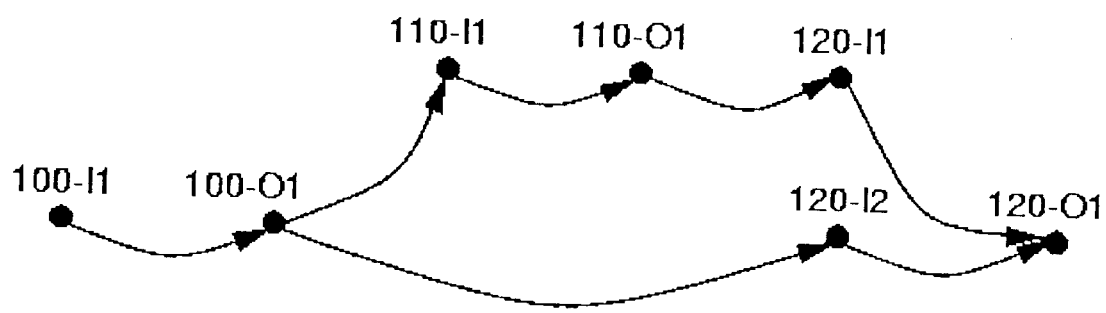
FIG. 4 shows a timing graph for the previous example wherein each node represents a pin on one of the circuit elements and each arc, a block input to output connection or a source to sink connection.

The timing graph associated with the example is shown with reference to FIG. 4. Each node represents a pin on one of the circuit elements and each arc represents a block input to output connection or a net source to sink connection.

After inputting the design and technology information in step 5, one proceeds to step 10 in which net segment capacitances are computed based on K=Kmax=1. In this example, only the net segments along grid line V3 between grid lines H2 and H3 exhibit any coupling. For these segments the late capacitances is given by:

$$Cg+Cc*(1+K)=1+1*(1+1)=3,$$

and early capacitances are $$Cg+Cc*(1-K)=1+1*(1-1)=1.$$

All other net segments showing no coupling, have both an early and a late capacitance of 1. These segment capacitance are then used in step 15 to compute delays, slews, ATs, RATs, and slacks. For example, the total early and late capacitances (wire+sink pin) of net 200 fed by block 100 are 8 and 10, respectively, so the early and late delays of block 100 are 50 and 60, respectively. The early and late mode slews at timing point 100-O1 are 29 and 35, respectively, Finally, the early and late mode ATs at pin 100-O1 are 50 an 60, respectively. The late mode Elmore delay for the delay arc between 100-O1 and 110-I1 is $$1*(1.5+2)+1*(0.5+5)+1*(0.5+9)=18.5.$$

The following tables summarize the timing results.

| From | To | Early Elmore Delay | Early Delay | Late Elmore Delay | Late Delay |
|---|---|---|---|---|---|
| 100-I1 | 100-O1 | — | 50 | — | 60 |
| 100-O1 | 110-I1 | 13.5 | 6.75 | 18.5 | 9.25 |
| 100-O1 | 120-I2 | 10 | 5 | 12 | 6 |
| 110-I1 | 110-O1 | — | 35 | — | 45 |
| 110-O1 | 120-I1 | 10.5 | 5.25 | 11.5 | 5.75 |
| 120-I1 | 120-O1 | — | 10 | — | 10 |
| 120-I2 | 120-O1 | — | 10 | — | 10 |

| Point | Early AT | Early RAT | Early Slack | Early Slew | Late AT | Late RAT | Late Slack | Late Slew |
|---|---|---|---|---|---|---|---|---|
| 100-I1 | 0 | −15 | 15 | 0 | 0 | −10 | −10 | 0 |
| 100-O1 | 50 | 35 | 15 | 29 | 60 | 50 | −10 | 35 |
| 110-I1 | 56.75 | 9.75 | 57 | 42.5 | 69.25 | 59.25 | −10 | 53.5 |
| 110-O1 | 91.75 | 44.75 | 57 | 20 | 114.25 | 104.25 | −10 | 26 |
| 120-I1 | 97 | 40 | 57 | 30.5 | 120 | 110 | −10 | 37.5 |
| 120-I2 | 55 | 40 | 15 | 39 | 66 | 110 | 44 | 47 |
| 120-O2 | 65 | 50 | 15 | 5 | 130 | 120 | −10 | 5 |

In the next step 20, the timing update is performed and will be described in conjunction with the second flowchart shown for each nets.

Applying the method first to net 200, it is determined in step 45 that net 200 is coupled to another net i.e., 210. Step 50 follows, wherein it is determined that the late mode slack on the net (specifically on pin 100-O1) is below the threshold of 0 slack. The next step 60 now takes place. Since only the late mode slack is less than the threshold, one needs only to look at the updates to the late mode K factor, capacitance, and timing values. For this example, step 55 is omitted and does not concern itself about the possible effects that changes in the early mode values for net 200 could have on net 210. In step 60A, the victim arrival time window is determined to be from ATlate(100-O1)−0.5*SLEWlate(100-O1) to max(ATlate(110-I1)+0.5*SLEWlate(110-I1), ATlate(120-I2)+0.5*SLEWlate(120-I2) ), or from 42.5 to 96. In step 60B, the aggressor arrival time window is determined to go from ATearly(110-O1)−0.5*SLEWearly(110-O1) to ATlate(120-I1)+0.5*SLEWlate(120-I1), or from 81.75 to 138.75. In step 60C, the overlap is found to be 14.25. In step 60D, K value=0.71 and in step 60E, Kupper=1.0. In step 65 it is determined that the change in K moves the victim arrival time window away from the only possible aggressor arrival time window and thus the arrival time window overlap cannot increase. The updating process for net 200 is now complete, and exit flow 200.

Applying the method of the second flowchart to net 210, in step 45 it is determined that net 210 is not coupled to another net (200), so one proceeds with step 50. In step 50, the late mode slack on the net (specifically on pin 110-O1) remains below the threshold of 0 slack; so one proceeds to step 60. Since only the late mode slack is less than the threshold, one needs only to look at updates to the late mode K factor, capacitance, and timing values. In step 60A, the victim arrival time window is determined from ATlate(110-O1)−0.5*SLEWlate(110-O1) to ATlate(120-I1)+0.5*SLEWlate(120-I1), or from 101.25 to 138.75. In step 60B, the aggressor arrival time window is determined from ATearly(100-O1)−0.5*SLEWearly(100-O1) to ATlate(110-I1)+0.5*SLEWlate(110-I1), or from 35.5 to 96. In step 60C, the overlap is found to be 0. In step 60D, the K value is 0 and in step 60E it is determined that Kupper=1.0.

In step 65, the change in K value is determined to have moved the victim arrival time window toward the aggressor arrival time window, potentially increasing the arrival time window overlap. One then proceeds to step 70 wherein a determination of the iteration limit (e.g., 3) shows that it has not been reached. Thus, one proceeds with step 75. Herein, the late mode effective grounded capacitances for the segment are fund to be 2.0, and an update of the delay and timing values for the pins of the victim net are obtained as shown below:

| From | To | Late Elmore delay | Late Delay |
|---|---|---|---|
| 110-I1 | 110-01 | — | 40 |
| 110-O1 | 120-I1 | 11 | 5.5 |

| Point | Late AT | Late RAT | Late Slack | Late Slew |
|---|---|---|---|---|
| 110-O1 | 109.25 | 104.5 | −4.75 | 23 |
| 120-I1 | 114.75 | 110 | −4.75 | 34 |

From these updated values a new victim arrival time window is computed in step 60A (the aggressor arrival time window does not change) from 97.75 to 131.75. The overlap in step 60C is recomputed and found to be 0.0. Accordingly, K value computed in step 60D remains at 0. Since K did not change, Kupper and Klower values are not needed and step 60E may be skipped. One then proceeds to step 65 where it is determined that, since K has converged, no further recalculation is needed. This completes the updating process for net 210.

After step 20 in the main flow is finished and timing updates have been performed for all nets in the design, propagation of timing changes provide the following timing values:

| From | To | Early Elmore Delay | From Early Delay | Late Elmore Delay | Late Delay |
|---|---|---|---|---|---|
| 100-I1 | 100-O1 | — | 50 | — | 58.55 |
| 100-O1 | 110-I1 | 13.5 | 6.75 | 17.47 | 8.74 |
| 100-O1 | 120-I2 | 10 | 5 | 11.71 | 5.86 |
| 110-I1 | 110-O1 | — | 35 | — | 40 |
| 110-O1 | 120-I1 | 10.5 | 5.25 | 11 | 5.5 |
| 120-I1 | 120-O1 | — | 10 | — | 10 |
| 120-I2 | 120-O1 | — | 10 | — | 10 |

| Point | Early AT | Early RAT | Early Slack | Early Slew | Late AT | Late RAT | Late Slack | Late Slew |
|---|---|---|---|---|---|---|---|---|
| 100-I1 | 0 | −15 | 15 | 0 | 0 | −2.79 | −2.79 | 0 |
| 100-O1 | 50 | 35 | 15 | 29 | 58.55 | 55.76 | −2.79 | 34.13 |
| 110-I1 | 56.75 | 9.75 | 57 | 42.5 | 67.29 | 64.5 | −2.79 | 51.6 |
| 110-O1 | 91.75 | 44.75 | 57 | 20 | 107.29 | 104.5 | −2.79 | 23 |
| 120-I1 | 97 | 40 | 57 | 30.5 | 112.79 | 110 | −2.79 | 34 |
| 120-I2 | 55 | 40 | 15 | 39 | 64.41 | 110 | 45.59 | 45.84 |
| 120-O2 | 65 | 50 | 15 | 5 | 122.79 | 120 | −2.79 | 5 |

Proceeding with step 25, since it has been determined that the K values have changed, an iteration must be performed. In step 30, the iteration limit (e.g., of 1) is reached, so the process is complete. Because of the local iteration loop which took place in the flow chart shown in FIG. 2, steps 35 and 40 in the main flow are unnecessary. So the values in the final tables above are the final values returned. The net result is that the initial pessimistic bound has been reduced on the negative slack from −10 to −2.79, in one iteration through the method applied. Even though one may be able to improve the timing further in additional iterations, the values returned represent safe bounds on the actual slacks.

While the invention has been described in terms of a single preferred embodiment, those skilled in the art will recognize that many changes and modifications may be practiced on the sequence and nature of the individual steps of the method described herein. These are deemed to remain within the scope and the spirit of the appended claims.

What is claimed is:

1. A method for incorporating coupling interaction in a static timing analysis performed on an integrated circuit chip comprising the steps of:
   a) performing a static timing analysis using computed timing parameters which are a function of an equivalent grounded net capacitance of at least one selected victim net, the equivalent grounded net capacitance being based on a pessimistic assumption regarding the coupling interaction of the at least one selected victim net with aggressor nets to which it is coupled;
   b) updating the equivalent grounded net capacitance of the at least one selected victim net based on overlap between an arrival time window of the selected victim net and possible arrival time windows of the aggressor nets which are coupled to the selected victim net;
   c) updating the static timing analysis based on the updated equivalent grounded net capacitance of the at least one selected victim net, and;
   d) repeating steps b) and c) to iteratively reduce the pessimism of the static timing analysis results until a stopping criterion is satisfied.

2. The method of claim 1 wherein the arrival time window of the selected victim net extends from a start of a signal transition at a net source to an end of the signal transition at a net sink.

3. The method of claim 1 wherein the possible aggressor net arrival time window extends from a start of an early mode signal transition at an agressor net source to an end of a late mode transition at an agressor net sink.

4. The method of claim 3 wherein the end of the aggressor arrival time window is extended by a time required for the selected victim net to recover from a noise pulse coupled to the selected victim net from the aggressor net.

5. A method for incorporating coupling interaction in a static timing analysis performed on an integrated circuit chip comprising the steps of:
   a) performing a static timing analysis using computed timing parameters which are a function of an equivalent grounded net capacitance of at least one selected victim net, the equivalent grounded net capacitance being based on a pessimistic assumption regarding the coupling interaction of the at least one selected victim net with aggressor nets to which it is coupled;
   b) updating the equivalent grounded net capacitance of the at least one selected victim net based on a slew of the selected victim net and slews of the aggressor nets which are coupled to the selected victim net;
   c) updating the static timing analysis based on the updated equivalent grounded net capacitance of the at least one selected victim net, and;
   d) repeating steps b) and c) to iteratively reduce the pessimism of the static timing analysis results until a stopping criterion is satisfied.

6. The method of claim 5 wherein the aggressor net slew is an early mode slew of the aggressor net.

7. The method as recited in claim 5, wherein the stopping criterion is the failure of static timing results to change in two successive iterations.

8. The method as recited in claim 5, wherein the stopping criterion is the completion of a specified number of iterations.

9. A method for incorporating coupling interaction in a static timing analysis performed on an integrated circuit chip comprising the steps of:
   a) performing a static timing analysis using computed timing parameters which are a function of an equivalent grounded net capacitance of at least one selected victim net, the equivalent grounded net capacitance being based on a pessimistic assumption regarding the coupling interaction of the at least one selected victim net with aggressor nets to which it is coupled;
   b) updating the equivalent grounded net capacitance of the at least one selected victim net based on
      1) an overlap between an arrival time window of the selected victim net and possible arrival time windows of the aggressor nets which are coupled to the selected victim net, and
      2) a slew of the selected victim net and slews of the aggressor nets which are coupled to the selected victim net;
   c) updating the static timing analysis based on the updated equivalent grounded net capacitance of the at least one selected victim net, and;
   d) repeating steps b) and c) to iteratively reduce the pessimism of the static timing analysis results until a stopping criterion is satisfied.

10. The method as recited in claim 9, wherein the updated equivalent grounded net capacitance is computed by first determining an amount of charge required to charge a coupling capacitance Cc between the selected victim net and the aggressor nets to which it is coupled with both the victim and aggressor nets switching and then finding the equivalent grounded net capacitance which would require that same charge to charge if only the victim net were switching.

11. The method as recited in claim 10, wherein the coupling capacitance Cc between the selected victim net and the aggressor net is replaced by $(1+K)Cc$ for computing a late mode timing value and $(1-K)Cc$ for computing an early mode timing value, where K is based on arrival time window overlaps between the slews of the victim and aggressor nets.

12. The method as recited in claim 11, wherein the value of K is determined by the equation:

$$K=\{IP/\text{slew}(\text{aggressor})\}*\min\{K_{max}, \text{slew}(\text{victim})/IP\}$$

wherein IP is the period of interaction between two waveforms, given by:

$$IP=\min(\text{overlap}, \text{slew}(\text{aggressor}), \text{slew}(\text{victim})).$$

13. The method as recited in claim 12, further comprising the step of repeating the static timing analysis until the value for K of all the selected nets converge or until a predetermined iteration limit is reached.

14. The method of claim 13 wherein a final static timing analysis is performed using, for each selected victim and aggressor net pair, the larger of the K values computed during the last two iterations.

15. The method of claim 11, wherein the step of updating the equivalent grounded net capacitance of the selected victim net farther includes the steps of:
   computing upper and lower bounds on the value of K for each aggressor net;
   repeatedly updating the equivalent grounded net capacitance and resulting victim arrival time window until an iteration limit is reached or the K value stops changing; and
   using the computed upper bound K value to update the equivalent grounded net capacitance in the event that the iteration limit is reached before the K value stops changing.

16. The method as recited in claim 9, wherein the static timing analysis further comprises the step of repeatedly selecting a set of victim nets and updating the capacitance of the selected victim nets, the timing analysis depending on updated slew values and updated arrival time windows.

17. The method as recited in claim 9, wherein the ratio between the victim and the aggressor slews statically determines an effective loading seen by the victim.

18. The method as recited in claim 9, wherein the degree of overlap between the victim and aggressor arrival time windows statically determines the effective loading seen by the victim.

19. The method of claim 13 wherein the selected victim nets whose capacitance values are updated in each repetition include those whose slack is less than a specified threshold value.

20. The method of claim 19 wherein the selected victim nets whose capacitance values are updated in each repetition also include those which are coupled to other selected nets.

21. The method of claim 9 wherein an early mode capacitance is computed assuming that the aggressor net is switching in the same direction as the selected victim net and a late mode capacitance is computed assuming that the aggressor net is switching in the opposite direction from the selected victim net.

22. The method of claim 21 wherein the aggressor net slew used to compute the selected victim equivalent grounded net capacitance is computed from the early mode aggressor equivalent grounded net capacitance.

23. The method of claim 22 wherein each aggressor net slew used to compute the late mode capacitance of the a selected victim net is computed from an early mode capacitance computed assuming that the selected victim net switches in the opposite direction from the aggressor net.

24. The method as recited in claim 9, wherein the stopping criterion is the failure of static timing results to change in two successive iterations.

25. The method as recited in claim 9, wherein the stopping criterion is the completion of a specified number of iterations.

* * * * *